United States Patent [19]

Ito

[11] Patent Number: 4,603,930
[45] Date of Patent: Aug. 5, 1986

[54] INTERCONNECTION APPARATUS FOR WIRING HARNESSES

[75] Inventor: Mitsuru Ito, Kuwana, Japan

[73] Assignees: Tokai Electric Wire Company Limited; Sumitomo Electric Industries Ltd., both of Japan

[21] Appl. No.: 626,695

[22] Filed: Jul. 2, 1984

[30] Foreign Application Priority Data

Jul. 5, 1983 [JP] Japan ................. 58-122642

[51] Int. Cl.4 .............................. H01R 9/09
[52] U.S. Cl. .................... 339/17 R; 361/399
[58] Field of Search .............. 339/17 R, 17 C, 17 L, 339/17 LM, 17 M; 361/392, 393, 394, 395, 396, 399, 408, 412, 415

[56] References Cited

U.S. PATENT DOCUMENTS

| 3,270,311 | 8/1966 | Deer et al. | 339/176 MP |
| 3,501,582 | 3/1970 | Heidler et al. | 361/399 |
| 3,596,235 | 7/1971 | Teurlings | 339/176 MP |
| 3,601,752 | 8/1971 | Pauza | 339/17 R |
| 3,764,955 | 10/1973 | Ward | 339/176 MP |
| 4,135,226 | 1/1979 | Kourimsky | 361/415 |
| 4,218,724 | 8/1980 | Kaufman | 361/412 |

Primary Examiner—Neil Abrams
Attorney, Agent, or Firm—Ernest A. Beutler

[57] ABSTRACT

An interconnection apparatus for wiring harnesses includes an insulating wiring board and a cover for covering the wiring board. The wiring board is formed on one surface with a busbar pattern of a busbar to form branch conductive paths and on the other surface with a printed wiring pattern interconnecting the branch conductive paths and functional components.

6 Claims, 7 Drawing Figures

INTERCONNECTION APPARATUS FOR WIRING HARNESSES

The present invention relates to improvements in and relating to an interconnection apparatus for wiring harnesses in which a large number of branch conductive paths are formed by the arrangement of a busbar and are connected to the cables of a wiring harness to construct the desired branch circuits.

Wiring harnesses heretofore used for the interior wiring of automobiles require a large number of branch circuits in the midst of the wiring harness and an interconnection apparatus for wiring harnesses (hereinafter simply referred to as an interconnection apparatus) is known in the art in which the corresponding branch conductive paths to the branch circuits of the wiring harness are concentrically formed on a wiring board by the arrangement of a busbar and the cables of the wiring harness are connected to the branch conductive paths thereby concentrically constructing the desired branch circuits. Then, in order to ensure the functioning of these branch circuits, e.g., a flasher relay, etc., it is necessary that the control element, i.e., relay and functional components such as diodes and capacitors required for each branch circuit are arranged and their electronic circuit is incorporated in the branch circuit. Then, there is a marked tendency toward further increasing the complexity of such electronic circuits.

In order to make the interconnection apparatus having these tends more compact and smaller in size, the applicant has proposed in Japanese Patent Application No. 57-194851, etc., a novel interconnection apparatus comprising in combination a wiring board including the desired branch conductive path group formed by the arrangement of a busbar and a plurality of printed-circuit boards having concentrically and densely arranged thereon the required functional component group for the branch circuit group of a wiring harness whereby the printed-circuit boards are detatchably mounted on the wiring board and the terminals provided at the side edges of the printed-circuit boards are connected to the ends of the busbar of the wiring board thereby incorporating and connecting the functional component circuits of the printed-circuit boards to the branch conductive paths.

The present invention has been made in view of the above-mentioned trends and it is an object of the present invention to make smaller and more compact an interconnection apparatus of the type including simple circuitry and functional component assembly for two-wheeled vehicles, for example.

More specifically, the present invention features a novel construction in which a busbar pattern including branch conductive paths formed by the arrangement of a busbar and a printed-wiring pattern including a functional component group arranged densely and its functional components circuits formed by printed wiring are formed on a single-layer insulating board thereby incorporating and connecting the functional component circuits in the branch conductive paths.

Thus, in accordance with the interconnection apparatus of this invention, the desired branch conductive path group and functional component circuits are formed on a single-layer insulating board and are interconnected thereby making the interconnection apparatus considerably smaller and compact than previously.

The present invention will be apparent from the following detailed description taken in conjunction with the accompanying drawings, in which.

Figure 1:
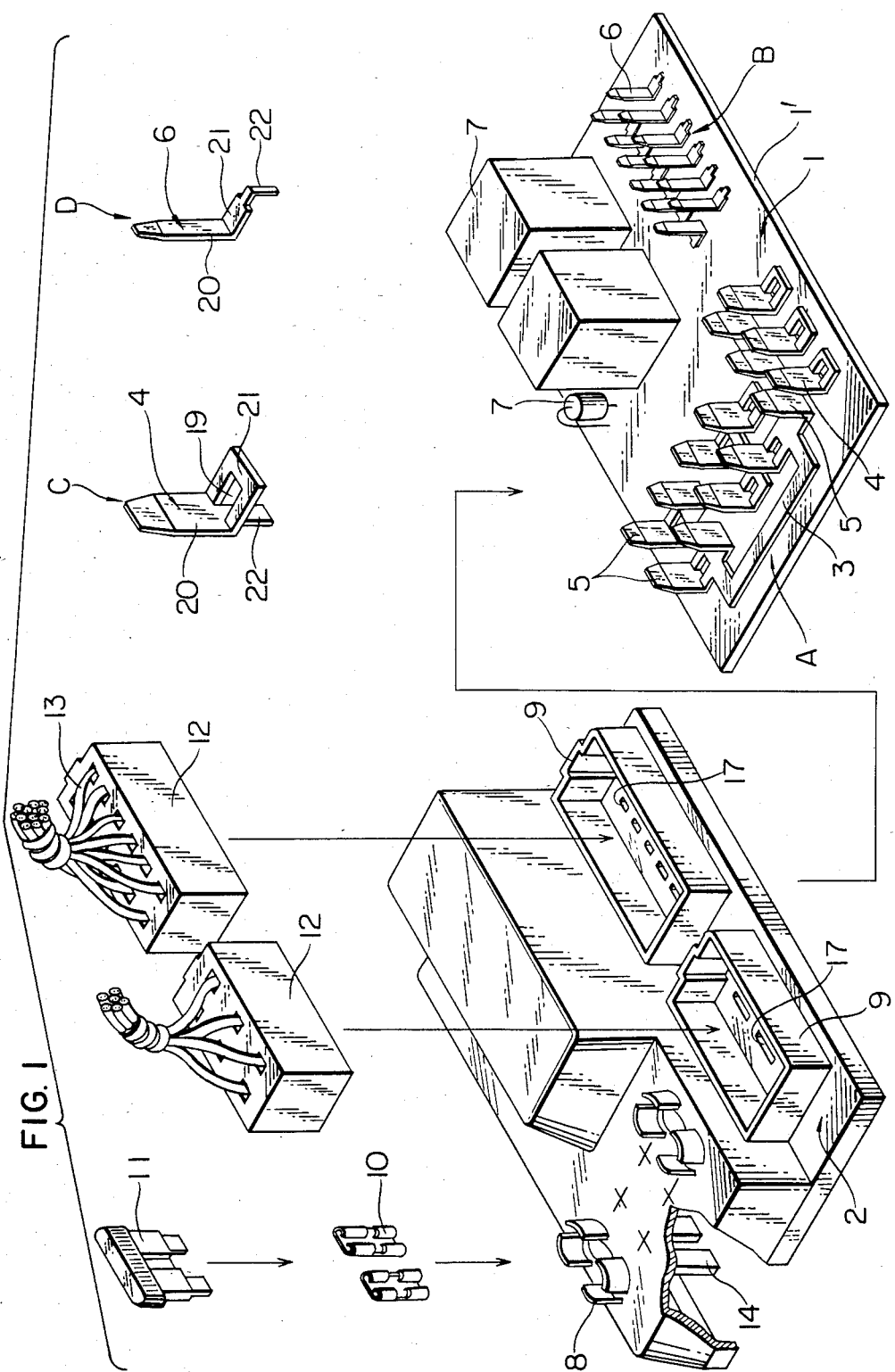
FIG. 1 is a perspective view showing an interconnection apparatus according to an embodiment of the invention.
Figure 2:
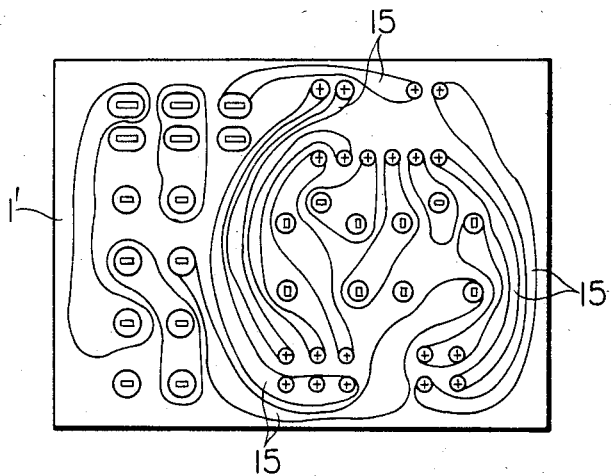
FIG. 2 is a plan view of the back of the wiring board in the embodiment of FIG. 1.
Figure 3:
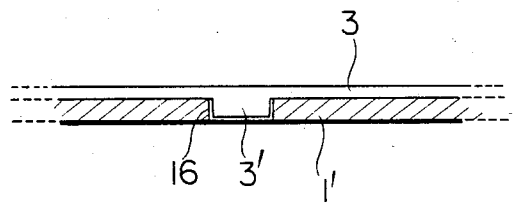
FIGS. 3 and 4 are front sectional views showing respectively the coupling of the busbar and the insulating board and the connection of the busbar and the printed conductive path in FIG. 1.

The present invention will now be described in a greater detail with reference to an embodiment of the invention. Referring to FIGS. 1 to 7 showing the embodiment, an interconnection apparatus of the invention includes a wiring board 1 comprising a single-layer insulating board 1' and a cover 2 placed over the wiring board 1. In FIG. 1, the left path of the wiring board 1 includes a busbar pattern A including the desired branch conductive path group formed by a busbar 3 and the right part includes a printed wiring pattern B including a group of functional components 7 arranged densely on the insulating board 1' and printed conductive paths 15 (see FIG. 2) on the back forming the circuits of the functional components 7 by printed wiring. More specifically the busbar 3 of the busbar pattern A forms the desired branch conductive paths on the single-layer insulating board 1' and the busbar 3 is provided with downwardly projected mounting pieces 3' which are fitted in mounting holes 16 of the insulating board 1' for positioning the busbar 3 and tab contact members 5 vertically arranged at its end portions. After the mounting of the cover 2 which will be described later, a fuse 11 is fitted on the tab contact members 5 through intermediate terminals 10 or connectors 12 at the end of bundles of cables 13 are fitted on the tab contact members 5.

Figure 5:
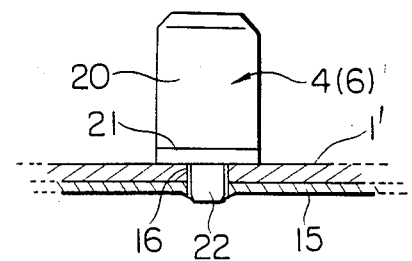
FIG. 5 is a front sectional view showing the manner in which the tab terminals are mounted.

On the other hand, the printed wiring pattern B includes tab terminals 4 and 6 arranged vertically on the insulating board 1' and connected to the printed conductive paths 15 on the back of the insulating board 1' and the tab terminals 4 and 6 are adapted for connection with the connectors 12 to incorporate and connect the functional component circuits provided by the printed conductive paths 15 in the branch circuits of a wiring harness. On the other hand, the printed conductive paths 15 of the functional components 7 associated for example with the fuse are connected to the busbar 3 so that the functional component circuits provided by the printed conductive paths 15 are incorporated and connected to the branch conductive paths of the busbar 3. More specifically, as shown at C in FIG. 1, each tab terminal 4 includes a plate base portion 21, a tab contact portion formed by bending one end of the base portion 21 by 90°, a window 19 cut out in the base portion 21 and a conductive piece 22 provided by forming the cutout material into a leg shape. Also, as shown at D in FIG. 1, each tab terminal 6 includes a plate base portion 21 and a tab contact portion 20 and a leg conductive piece 22 which are formed by bending the ends of the base portion 21 in the opposite directions by 90°. Then, each tab terminal 4 or 6 is pertically arranged on the wiring board 1 and the conductive piece 22 is fitted into the mounting hole 16 of the insulating board 1 and soldered at its forward end to the printed conductive path 15 on the back of the insulating board 1' as shown in FIG. 5.

Figure 4:
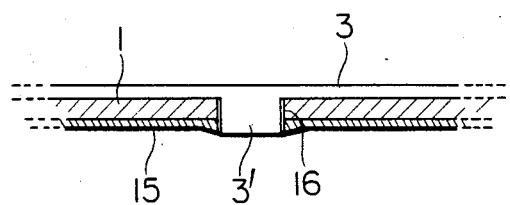

On the other hand, the busbar 3 is connected to the printed conductive paths 15 by inserting the mounting pieces 3' projecting downwardly from the side edges of the busbar 3 into the mounting holes 16 of the insulating board 1' and soldering the forward ends of the mounting pieces 3' to the printed conductive paths 5 as shown in FIG. 4.

Figure 6:
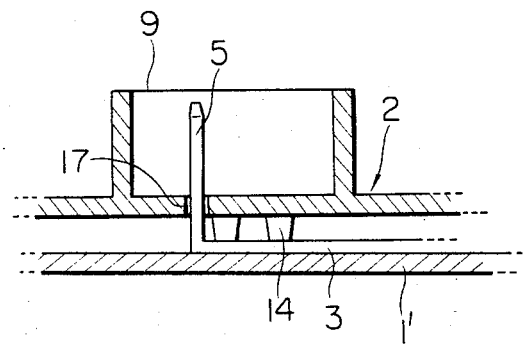
FIGS. 6 and 7 are front sectional views showing the function of the press pieces in the embodiment of FIG. 1.
Figure 7:
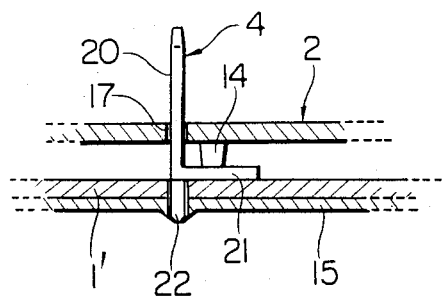

On the other hand, the cover 2 which is placed over the above-mentioned wiring board 1, is made of a thin sheet of resin material which is mounted to shield and enclose the busbar 3 and the functional components 7 on the wiring board 1 and thereby insulate and protect them. Arranged on the upper surface of the cover 2 are fuse mounts 8 and connector mounts 9 in frame form and the connector mounts 9 are formed therethrough with holes 17 through which are inserted the tab contact portions 5 and the tab contact portions 20 of the tab terminals 4 and 6. Also, a large number of press pieces 14 are arranged at suitable positions on the inner side of the cover 2 so that when the cover 2 is mounted on the wiring board 1, each of the press pieces 14 contacts and presses from above the busbar at the base of the tab contact member 5 or the base portion 21 of the tab terminal 4 or 6 as shown in FIG. 6 or 7. It is to be noted that the cover 2 is adapted to cover the wiring board 1 so as to accommodate its peripheral edges and it is provided, though not shown, with locking pawls or the like on the inner side of its peripheral edges so as to lock the cover 2 in its mounted position and thereby prevent it from being removed easily. Also, if necessary, the cover 2 is provided with a locking mechanism which locks and unlocks the cover 2 as desired.

In accordance with the interconnection apparatus of this invention constructed as described above, after the cover 2 has been mounted, locked and assembled to the wiring board 1, the fuse 11 is fitted in the fuse mount 8 through the intermediate terminals 10 and the connectors 12 are connected to the connector mounts 9 thereby forming the desired branch circuit group in the midst of the wiring harness and incorporating and connecting the required functional component circuits in the respective branch circuits.

As described hereinabove, in according with the interconnection apparatus of this invention, by virtue of the fact that both the busbar pattern A and the printed wiring pattern B are formed on the same single-layer insulating board 1' and the busbar pattern A and the printed wiring pattern B are interconnected without requiring each mechanical contact means as terminals, intermediate terminals, etc., the apparatus is greatly reduced in size, made compact considerably and greatly reduced in weight. By so making the apparatus compact, it is possible to reduce the number of component parts and thereby reduce the cost and improve the quality, reliability, etc.

Further, in accordance with the interconnection apparatus of this invention, by virtue of the fact that the apparatus includes the press pieces 14 and the tab terminals 4 and 6 which are designed as mentioned previously and the mounting of the cover 2 on the wiring board 1 causes the press pieces 14 to press down the busbar 3 forming the bars of the tab contact members 5 and the base portions 21 of the tab terminals 4 and 6, when the connectors 12 and the fuse 11 fitted on the tab contacts 5 and 20 are removed, the external force due to the removing resistance is borne by the cover 2 locked to the wiring board 1 and thus there is no danger of any undesired external force being borne by the tab contact members 5 and the conductive pieces 22 of the tab terminals 4 and 6. As a result, there are advantages that there is no danger of deforming the tab contact members 5 and causing disordering and collapsing of the busbar 3 but maintaining them in the proper forms and that there is no danger of causing any damages to the soldered portions of the conductive pieces 22 of the tab terminals 4 and 6 but satisfactorily stabilizing their current conducting performance.

From the foregoing description it will be seen that in the interconnection apparatus of this invention, both the branch circuits and the functional component circuits are so simplified that they are well suited for use for example with two-wheeled vehicles and there is the effect of meeting the recent need for compact apparatus.

I claim:

1. In an interconnection apparatus for wiring harnesses including a wiring board including a single-layer insulating board and a cover fitted over the wiring board to cover the same, the improvement wherein said wiring board comprises branch conductive path means formed by a busbar mounted on said insulating board and having a predetermined pattern including a plurality of tab contact members adapted to be connected to branch circuit means of the wiring harness, functional component circuit means formed by a plurality of functional components mounted on said insulating board and positioned on said wiring board to be fitted within the periphery of said cover, and printed wiring circuit means formed on said insulating board and interconnecting said branch conductive path means and said functional componenent circuit means, each of said tab contact members being formed into an L-shape and having a first leg extending parallel to said insulating board and in circuit with said printed wiring circuit means and a second terminal leg extending perpendicularly to said wiring board, said cover including a plurality of press pieces disposed to engage said first legs of said L-shaped tab contact members and restrain them relative to the insulating board to restrain them upon removal of an attached connector.

2. An apparatus according to claim 1, wherein the cover press pieces each engage the respective first legs of the L-shaped tab contact members for holding the contact members into contact with the insulating board, the second terminal legs of the tab contact members being accessible externally of the cover for attachment and detachment of an associated connector when the cover is attached to the insulating board.

3. An apparatus according to claim 2, wherein the cover is formed with a plurality of openings through which the respective second terminal legs of the tab contact members extend.

4. An apparatus according to claim 1, wherein the printed circuit is formed on the opposite side of the wiring board from the side engaged by the first leg of the tab contact members, the tab contact members having a third leg extending through the insulating board and in circuit with the printed circuit.

5. An apparatus according to claim 4, wherein the busbar is on the same side of the insulating board as that engaged by the first tab contact member legs.

6. An apparatus according to claim 1, wherein the busbar is mounted on one side of the insulating board and the printed wiring circuit is on the other side of the insulating board.

* * * * *